(12) United States Patent
Pipe (10) Patent No.: US 6,853,189 B1
(45) Date of Patent: Feb. 8, 2005

(54) METHOD AND SYSTEM OF QUANTITATIVELY ASSESSING DIFFUSION CHARACTERISTICS IN A TISSUE

(75) Inventor: James G. Pipe, Peoria, AZ (US)

(73) Assignee: Catholic Healthcare West, California Nonprofit Public Benefit Corporation, Phoenix, AZ (US)

( * ) Notice: Subject to any disclaimer, the term of this patent is extended or adjusted under 35 U.S.C. 154(b) by 0 days.

(21) Appl. No.: 10/673,865

(22) Filed: Sep. 29, 2003

Related U.S. Application Data (60) Provisional application No. 60/471,589, filed on May 19, 2003.

(51) Int. Cl.$^7$ ................................................. G01V 3/00
(52) U.S. Cl. ....................................... 324/307; 324/309
(58) Field of Search ................................. 324/318, 319, 324/322, 309, 307; 600/410

(56) References Cited

U.S. PATENT DOCUMENTS

| | | | | |
|---|---|---|---|---|
| 5,539,310 A | * | 7/1996 | Basser et al. ................ | 324/307 |
| 5,786,692 A | * | 7/1998 | Maier et al. ................. | 324/307 |
| 5,969,524 A | | 10/1999 | Pierpaoli et al. | |
| 6,463,315 B1 | * | 10/2002 | Klingberg et al. .......... | 600/410 |
| 6,529,763 B1 | | 3/2003 | Cohen et al. | |
| 6,567,684 B1 | * | 5/2003 | Chenevert et al. .......... | 600/410 |
| 6,642,716 B1 | * | 11/2003 | Hoogenraad et al. ....... | 324/309 |

OTHER PUBLICATIONS

Pajevic, S. et al., Color Schemes to Represent the Orientation of Anisotropic Tissues from Diffusion Tensor Data: Application to White Matter Fiber Tract Mapping in the Human Brain, 1999, Magnetic Resonance in Medicine, vol. 42, pp. 526–540.

Pierpaoli, C. et al., Toward a Quantitative Assessment of Diffusion Anisotropy, 1996, Magnetic Resonance in Medicine, vol. 36, pp. 893–906.

* cited by examiner

*Primary Examiner*—Brij B. Shrivastav
(74) *Attorney, Agent, or Firm*—Ziolkowski Patent Solutions Group, LLC; Michael A. Della Penna; Carl B. Horton (57) ABSTRACT

A process and system to implement such a process is configured to determine diffusion properties within a region-of-interest. A metric or index of diffusion is determined from individual diffusion values corresponding to diffusion along, multiple diffusion directions relative to average diffusion at a related voxel or pair of voxels. The invention may be implemented to determine shared diffusion anisotropy between two voxels. Based on a value of a diffusion index or metric, the present invention provides an efficient and tensor-free technique of determining if diffusion in neighboring voxels is anisotropic and if the diffusion is oriented in the same direction within each voxel. The present invention may be used to rapidly determine fractional anisotropy in a single voxel or used to filter diffusion weighted imaging data. The present invention may also be used to color-code diffusion data such that diffusion and tract orientation are readily identifiable in a reconstructed image.

20 Claims, 3 Drawing Sheets

METHOD AND SYSTEM OF QUANTITATIVELY ASSESSING DIFFUSION CHARACTERISTICS IN A TISSUE

CROSS REFERENCE TO RELATED APPLICATIONS

The present invention claims the benefit of U.S. Ser. No. 60/471,589 filed May 19, 2003.

BACKGROUND OF THE INVENTION

The present invention relates generally to a method and system of processing diffusion weighted magnetic resonance (MR) data and, more particularly, to a tensor-free method and system of quantitative assessment of diffusion characteristics in a targeted tissue.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_1$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

It is generally well-known that MR imaging techniques may be exploited to non-invasively discriminate between normal and pathological tissues in a subject, such as a medical patient. One such MR imaging technique is predicated on the acquisition of diffusion-weighted MR data that enables a physician, radiologist, or other health care provider to assess diffusion anisotropy in a particular tissue region of a patient, such as in the human brain. Until recently, health care providers were unable to quantitatively assess diffusion. That is, MR imaging supported the acquisition and reconstruction of MR data that allowed a clinician to visually inspect and determine, from the reconstructed images, a qualitative measure of diffusion. Since assessment of diffusion was limited to a qualitative evaluation, the extent of the diagnosis process was limited to the experience and expertise of the health care provider as well as the quality of the data acquisition process. Moreover, patient movement, field inhomogeneities, and the like could negatively affect the data acquisition process thereby hindering a physician's or radiologists' ability to accurately assess diffusion when visually determining and making a diagnosis.

As a result, recently, quantitative approaches to diffusion weighted imaging have been proposed. With these quantitative approaches, a value of diffusion is determined that enables a clinician to quantitatively assess the diffusion in the tissue imaged to determine whether the tissue is normal or whether a pathology is present. Moreover, by quantitatively measuring diffusion, the degree of pathology may also be determined.

However, with some of these known quantitative approaches, a tensor-based approach is implemented. These conventional tensor-dependent approaches, however, significantly limit assessment of diffusion when diffusion extends or tracts along multiple directions in a particular imaging volume. Further, these conventional tensor-based techniques must make numerous assumptions regarding the diffusion data. As a result, the accuracy of the quantitative assessment is remarkably dependent on the assumptions made.

It would therefore be desirable to design a method and system of quantitatively assessing diffusion weighted data in diagnosing a tissue without making assumptions as required by a tensor-based model that is also applicable to voxels having multiple diffusion tracts.

BRIEF DESCRIPTION OF THE INVENTION

The present invention is directed to a method and system of assessing diffusion characteristics in a region-of-interest that overcomes the aforementioned drawbacks.

The present invention includes a process and system to implement such a process that is configured to determine diffusion properties within a region-of-interest. The invention may be implemented to determine shared diffusion anisotropy between two voxels. Based on the value of a diffusion index or metric, the present invention provides an efficient technique of determining if diffusion in neighboring voxels is anisotropic and if the diffusion is oriented in the same direction within each voxel. The present invention may be used to rapidly determine fractional anisotropy in a single voxel or used to filter diffusion weighted imaging data. The present invention may also be used to color-code diffusion data such that diffusion and tract orientation are readily identifiable in a reconstructed image.

Therefore, in accordance with one aspect, the present invention includes a method of assessing diffusion of a substance in a region-of-interest. The method includes the steps of determining a diffusion value for one or more individual directions in at least one voxel and determining a value of average diffusion in the at least one voxel. The method further includes the step of, from the individual diffusion values and the average diffusion value, determining a diffusion index indicative of diffusion in the at least one voxel.

According to another aspect, the present invention includes an MRI apparatus comprising a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images. The system also includes a computer programmed to access diffusion-weighted imaging data from a region-of-interest and isolate at least two adjacent voxels within the region-of-interest. The computer is further programmed to determine a metric indicative of diffusion along multiple directions in the at least two adjacent voxels without fitting diffusion-weighted imaging data from the at least two adjacent voxels to a tensor model.

In accordance with another aspect of the present invention, a computer readable storage medium having stored thereon a computer program representing a set of instruction is provided. The set of instructions, when executed by a computer, causes the computer to determine an individual diffusion value for each of N diffusion directions in at least one voxel and determine an average diffusion value for the at least one voxel. The set of instructions further causes the computer to determine a diffusion index indicative of diffusion anisotropy and diffusion direction in the at least one voxel.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
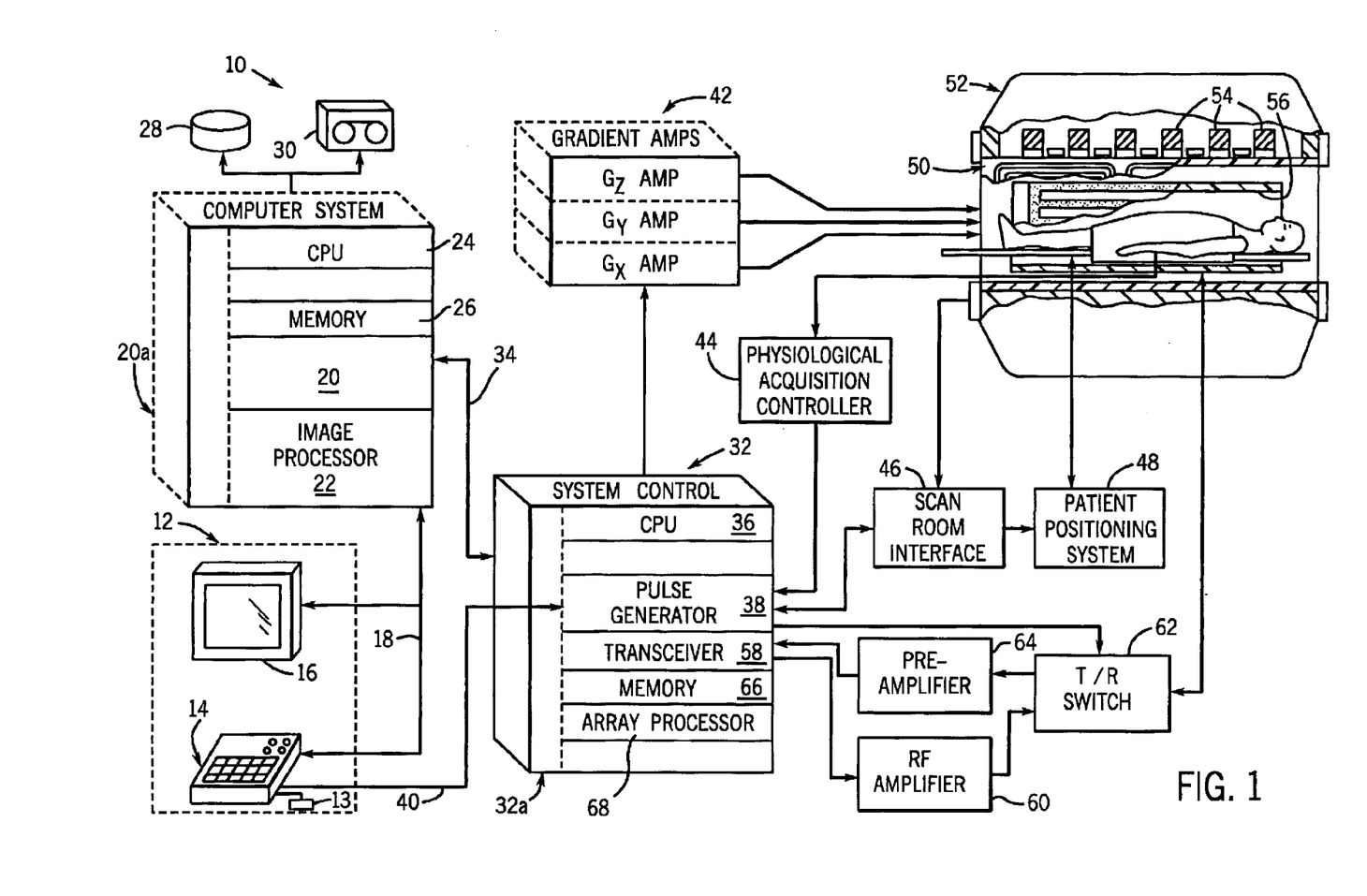
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to a method and system of quantitatively assessing diffusion in a region-of-interest or tissue. In particular, the present invention is well-suited for evaluating diffusion weighted imaging data acquired from a brain to identify and delineate between normal and pathological tissue. As will be discussed in greater detail, the present invention is directed to a technique of quantitative evaluation of diffusion weighted MR imaging data such that an index or metric of diffusion is determined and appropriately manipulated to assess diffusion of a substance, such as water or a contrast agent, in a tissue. Generally, the metric is defined as:

$$G(A, B) = \frac{\sum_{n=1}^{N} [(a_n - \bar{a})(b_n - \bar{b})]}{\sqrt{\sum_{n=1}^{N} a_n^2 \sum_{n=1}^{N} b_n^2}};\qquad \text{Eqn. 1}$$

where $\{a_n\}$ and $\{b_n\}$ are diffusion values measured in N different directions for two independent voxels A and B, and $\bar{a}$ and $\bar{b}$ are respective average diffusion values for the two voxels. This normalized covariance is slightly different than the standard definition of correlation, in which the denominator is the product of the standard deviations of $\{a_n\}$ and $\{b_n\}$ rather than their energies. This measure does not assume that diffusion is fully characterized by a tensor (i.e. no assumption of a single diffusion compartment), and may be used with arbitrary N. Eqn. 1 yields the following observations.

First, if either voxel A or B is isotropic, the covariance term in the numerator (and hence G) will be 0. Second, this covariance term will be positive if the larger diffusion terms in A and B are aligned, and smaller (or negative) if they are not. Third, the normalization in the denominator keeps G from varying with the average diffusion in A or B. Thus G reflects only the shape and relative orientation of the measured diffusion in these two voxels. Despite the independence of this metric from tensor assumptions, the above observations may be further supported by analytically calculating G using six diffusion directions, N=6, with a conventional tensor model. According to the prior art tensor-based model, in voxel A, diffusion is oriented along the axes $\{X':Y':Z\}$ ($D_{XY}=D_{XZ}=D_{YZ}=0$), where $\{X':Y'\}$ is rotated from $\{X:Y\}$ about the Z axis by an angle $\alpha$. Diffusion along X', Y', and Z is equal to $f_{ax} D_A$, $f_{ay} D_A$, and $f_{az} D_A$, respectively, where DA represents an arbitrary diffusion value and $f_{ax,y,z}$ represent directional deviations from this arbitrary diffusion value. For each direction n, the measured diffusion an for voxel A is equal to:

$$a_n = D_A(f_{ax} \cos^2[\alpha+\theta_n] \sin^2[\phi_n] + f_{ay} \sin^2[\alpha+\theta_n] \sin^2[\phi_n] + f_{az} \cos^2[\phi_n]); \quad \text{Eqn. 2}$$

where $\phi_n$ and $\theta_n$ are the spherical angles corresponding to the selected direction relative to the +Z axis and the +X axis, respectively. A similar equation is used for voxel B, but with diffusion values $f_{bx} D_B$, $f_{by} D_B$, and $f_{bz} D_B$ along axes $\{X":Y":Z\}$ (rotated by angle $\beta$ about the Z axis).

Inserting the values of a, and b, (n to 6) from Eqn. 2 into Eqn. 1 and simplifying yields the following:

$$G(A, B) = \frac{(f_{ax}+f_{ay}-2f_{az})(f_{bx}+f_{by}-2f_{bz}) + 3(f_{ax}-f_{ay})(f_{bx}-f_{by})\cos[2(\alpha-\beta)]}{3\sqrt{\frac{2(f_{ax}^2+f_{ay}^2+f_{az}^2)+}{(f_{ax}+f_{ay}+f_{az})^2}} \sqrt{\frac{2(f_{bx}^2+f_{by}^2+f_{bz}^2)+}{(f_{bx}+f_{by}+f_{bz})^2}}} . \quad \text{Eqn. 3}$$

The angular dependence in Eqn. 3 is only on $(\alpha-\beta)$, showing that G(A,B) is rotationally invariant along the Z axis. It should be noted that the global diffusion values $D_A$ and $D_B$ have dropped out due to normalization. This equation, which is consistent with tensor-based modules, is still quite large to be intuitive, so further assumptions may be made. For example, assuming voxels A and B have altered diffusion only along the X' and X" axes, respectively; the following assignment may be made: $f_{az}=f_{ay}=f_{bz}=f_{by}=1$, $f_{ax}=f_a$, and $f_{bx}=f_b$ in Eqn. 3. $F_{a,b}>1$ is consistent with a "cigar" diffusion model and $f_{a,b}<1$ is consistent with a "pancake" diffusion model. This now yields:

$$G(A,B) = \frac{(f_a-1)}{\sqrt{(3f_a^2+4f_a+8)}} \frac{(f_b-1)}{\sqrt{(3f_b^2+4f_b+8)}} \frac{1+3\cos(2\alpha)}{3}. \quad \text{Eqn. 4}$$

In Eqn. 4, $\alpha$ now represents the respective angle between the rotated x-axes of voxels A and B. The first two terms in Eqn. 4 are anisotropy terms; they are 0 for $f_a=1$ or $f_b=1$, respectively, and monotonically increase with $f_{a,b}$. The last term is an alignment term; it is maximum for $\alpha=0°$ or $180°$, and minimum for $\alpha=+/-90°$. This analysis illustrates that G is (1) large only if the diffusion values in both A and B are similarly anisotropic (e.g. $f_a>1$ and $f_b>1$, or $f_a<1$ and $f_b<1$), (2) zero if the diffusion in either A or B is isotropic, and (3) largest when the diffusion anisotropies of A and B are 'aligned' (i.e. $\alpha=0$ or $180°$).

As will be described below, the index or metric defined by Eqn. 1 may be manipulated to derivatively assess fractional anisotropy characteristics in a particular voxel, filter diffusion data to smooth noise between neighboring voxels, and color-code diffusion data. The following are examples illustrating applications in which the present invention may be implemented and is not exhaustive of those applications to which the invention may be applied as other applications are contemplated and considered within the scope of this invention.

As defined by Eqn. 1, the value G may be used to rapidly obtain a measure of fractional anisotropy with arbitrary N. In particular, the anisotropy metric GM involves setting all $b_i$ =an in Eqn. 1, and taking the square root of the result, i.e.:

$$G_{AA} = \sqrt{G(A, A)} = \frac{\sqrt{\sum_{n=1}^{N}[(a_n-\bar{a})^2]}}{\sqrt{\sum_{n=1}^{N} a_n^2}}. \quad \text{Eqn. 5}$$

The numerator in Eqn. 5 becomes the standard deviation of $\{a_n\}$, and the denominator normalizes the metric by the root mean squared diffusion value. The metric in Eqn. 5 uses the normalized standard deviation of diffusion rather than its variance (i.e. $\sqrt{G(A,A)}$ rather than $G(A,A)$) so that its behavior is more similar to a standard fractional anisotropy measure.

In the following example, a comparison between the present invention and a prior art, tensor-based approach is described. For N=6, an analytical relationship between $G_{AA}$ and the standard fractional anisotropy measure F can be established as follows. Using six selected directions of arbitrary orientation, the tensor parameters may be shown to be:

$$\begin{bmatrix} D_{xx} \\ D_{yy} \\ D_{zz} \\ D_{xy} \\ D_{xz} \\ D_{yz} \end{bmatrix} = \begin{bmatrix} c_1 & c_1 & c_2 & c_2 & c_3 & c_3 \\ c_2 & c_2 & c_3 & c_3 & c_1 & c_1 \\ c_3 & c_3 & c_1 & c_1 & c_2 & c_2 \\ 0 & 0 & 0 & 0 & c_4 & -c_4 \\ c_4 & -c_4 & 0 & 0 & 0 & 0 \\ 0 & 0 & c_4 & -c_4 & 0 & 0 \end{bmatrix} \begin{bmatrix} a_1 \\ a_2 \\ a_3 \\ a_4 \\ a_5 \\ a_6 \end{bmatrix}; \quad \text{Eqn. 6}$$

where $c_1 = \frac{105+47\sqrt{5}}{160+72\sqrt{5}}$, \quad Eqn. 7

$c_2 = -\frac{1}{4}$, $c_3 = \frac{15+7\sqrt{5}}{160+72\sqrt{5}}$, $c_4 = \frac{45+20\sqrt{5}}{80+36\sqrt{5}}$;

the D vector represents diffusion terms corresponding to the gradient axes, and the a vector contains the diffusion values along the directions of the applied diffusion gradients. Defining $$\bar{a} = \frac{\sum_{n=1}^{6} a_n}{6}; \quad \text{Eqn. 8}$$

$$a_{surface} = \frac{D_{xx}+D_{yy}+D_{xx}D_{zz}+D_{yy}D_{zz}-D_{xy}^2-D_{xz}^2-D_{yz}^2}{3}; \text{ and} \quad \text{Eqn. 9}$$

The conventional fractional anisotropy metric may be calculated using:

$$F = \sqrt{\frac{a_{mag} - a_{surface}}{a_{mag}}}. \quad \text{Eqn. 11}$$

Using Eqns. 6–11, an expression for F in terms of $a_n$ may be obtained. While this expression is quite long to be of use, this expression may be used along with Eqn. 5 to show that:

$$G_{AA} = \frac{2F}{\sqrt{15 - 6F^2}}. \quad \text{Eqn. 12}$$

One skilled in the art would appreciate that for 0<F<1, this equation is nearly linear. A plot of a two-dimensional histogram of F and $G_{AA}$ from the same image (including noise), would reveal that F and $G_{AA}$ follow this curve exactly, with no residue. As such, F may be obtained directly from $G_{AA}$. Moreover, the commonality in the plots would show that $G_{AA}$ and F give equivalent information when N=6 for the selected directions of diffusion. Thus, Eqn. 5 illustrates determining of fractional anisotropy for N=6 without the determining of a diffusion tensor. Furthermore, $G_{AA}$ may be calculated for arbitrary N. Numerous comparisons of $G_{AA}$ and F from in-vivo data have confirmed the unique one-to-one relationship in Eqn. 5 for every voxel, including noise, when N=6.

The present invention is also applicable to nonlinear filtering of DTI data prior to tractography, orientations display, or fractional anisotropy calculations. In this regard, nonlinearly averaging of every voxel in a 3D data set with itself and M neighbors may be carried out using the following expression:

$$\overline{p}_n(A) = \sum_{B}^{M+1} \left( \tilde{G}(A, B) p_n(B) \right) / \sum_{B}^{M+1} \tilde{G}(A, B); \quad \text{Eqn. 13}$$

where $p_n(B)$ is the MRI signal value for voxel B for the $n^{th}$ diffusion measurement, $\overline{p}_n$ is the new (filtered) data, $\tilde{G}(A,B) = \max[G(A,B), 0]$, and both summations are for voxel B equal to voxel A as well as its M neighbors. Using $\tilde{G}(A,B)$ simply turns all negative coefficients to 0; G(A,B) will be negative for crossing, perpendicular tracts, thereby allowing for smoothing of data within tracts, rather than let separate tracks affect each other's data.

From Eqn. 4, it can be expected that the output data $\overline{p}_n$ are significantly averaged with that of neighboring voxels if and only if: (a) both voxels are highly (and similady), anisotropic, and (b) the diffusion directions of both voxels are 'aligned'. Such a filter may prevent white matter at the edge of a tract from being smoothed with surrounding tissue with isotropic diffusion. The filter also prevents tracts which cross each other from being averaged, due to the dependence of G(A,B) on α. The filter may decrease anisotropy which may be due to noise reduction, which itself increases anisotropy.

The present invention is also applicable to show directional information in a single image. A number of techniques have been developed to generate such a display. Most of these techniques are predicated on an "absolute value" method for color display, in which the red, green, and blue channels correspond to $D_{XX}$, $D_{YY}$, and $D_{ZZ}$ multiplied by an anisotropy index. This can be rapidly approximated according to the present invention in the following way. First, N artificial diffusion values for unidirectional diffusion along each of the 3 axes (x, y, and z) are synthesized. These values may be referred to as $\{x_n\}$, $\{y_n\}$, and $\{z_n\}$. For example, $\{x_n\}$ are synthesized using Eqn. 2 with α=0, $f_{xx} D_x=1$, and $f_{xy}=f_{x2}=0$, leaving the following:

$$x_n = \cos^2[\theta_n] \sin^2[\phi_n] \quad \text{Eqn. 14;}$$

where $\theta_n$ and $\phi_n$ are the spherical coordinates of the N measurement directions. These measurements represent unit diffusion oriented purely along the x-axis.

Next, for each voxel A, three values (P, Γ, and B) are calculated as in the following example:

$$P(A) = G(A, X) + \frac{G_{AA}}{3}; \quad \text{Eqn. 15}$$

where X represents a "virtual" voxel with diffusion values $\{x_n\}$. The values Γ and B are calculated (e.g.) using G(A,Y) and G(A,Z) instead of G(A,X), respectively. The value P is assigned to the (e.g.) red channel for voxel A, while (e.g.) Γ(A) and B(A) are assigned to the green and blue channels, respectively. The rationale for this assignment is that the values of P, Γ, and B are proportional to the anisotropy of A and its orientation to each of the 3 axes, respectively.

The calculation of P(A) is now illustrated in more detail for N=6, using a simplified, conventional tensor model. For voxel A, it is assumed that $f_{ay}=f_{az}=1$ and $f_{ax}=f_a$ (i.e. following the assumptions leading up to Eqn. 4 for which the diffusion is anisotropic along a single direction x). The above-mentioned values B=0, $D_x=1$, $f_{xy}=f_{xz}=0$ and $f_{xx}=1$ may be substituted for voxel B (now the synthesized diffusion along X) in Eqn. 4 to get the following expression:

$$G(A, X) = \frac{f_a - 1 + 3(f_a - 1)\cos[2\alpha]}{3\sqrt{3}\sqrt{3f_a^2 + 4f_a + 8}}; \quad \text{Eqn. 16}$$

$$G_{AA} = \frac{2(f_a - 1)}{\sqrt{3}\sqrt{3f_a^2 + 4f_a + 8}}; \quad \text{Eqn. 17}$$

and $$P(A) = \frac{2(f_a - 1)\cos^2[\alpha]}{\sqrt{3}\sqrt{3f_a^2 + 4f_a + 8}} \quad \text{Eqn. 18}$$

$$= G_{AA} \cos^2[\alpha];$$

Thus, with a tensor model and the assumption $f_{ay}=f_{az}=1$, P(A) is proportional to the anisotropy of A multiplied by a smoothly varying angular function which is 1 when A is aligned with the x axis, and 0 when it is perpendicular. Eqn. 18 leads to the relationship $$P(A) + \Gamma(A) + B(A) = G_{AA} \quad \text{Eqn. 19,}$$

i.e. the red, green, and blue channels for any voxel add up to the anisotropy measure of the present invention, while the color indicates tract orientation. As such, the present invention does not require calculation of diffusion tensor values, nor of eigenvectors. The present invention can also be used with an arbitrary number N of diffusion measurements, i.e. more than six.

The present invention provides is a robust, functional, and rapid method for assessing diffusion anisotropy in a single voxel, or shared anisotropy between voxels. The techniques of the present invention provide a tensor-free selection that can be carried out with an arbitrary number of diffusion directions. The present invention, as will be described with respect to FIGS. 2–3, includes a method of processing and evaluating diffusion weighted imaging data that may be carried out, automatically, as a computer program by a one more computers, integrated or independent from an MRI system.

Figure 2:
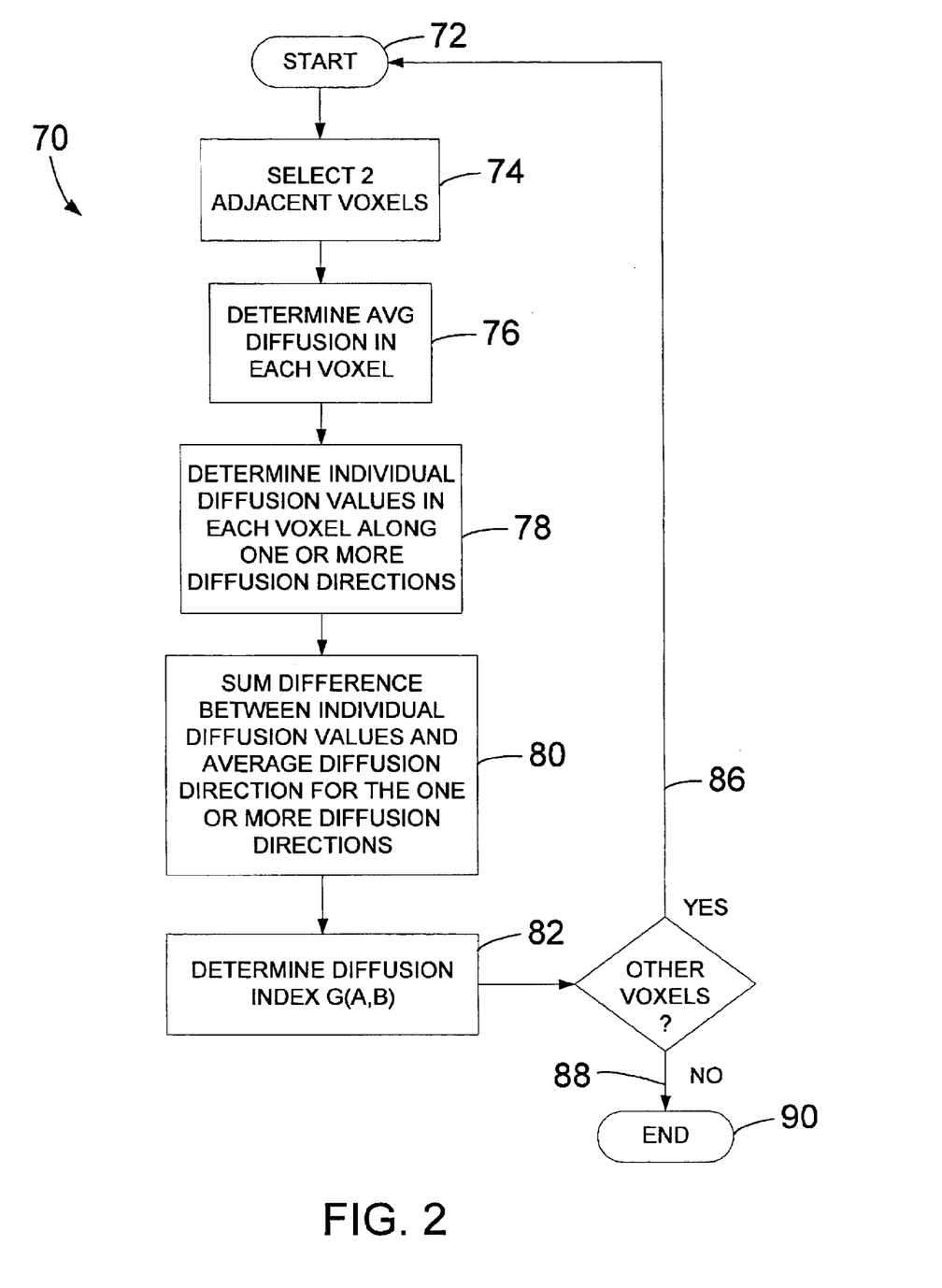
FIG. 2 is a flow chart setting forth the steps of a technique of quantitatively assessing diffusion in a region-of-interest.

Referring now to FIG. 2, the steps of a process 70 for determining diffusion similarity between two, preferably adjacent, voxels are set forth. The process 70 begins at 72 with the acquisition of diffusion weighted MR data in accordance with one of a number of known data acquisition and imaging techniques. After the MR data is acquired, two adjacent voxels are selected from a region-of-interest, i.e. targeted tissue. An average of diffusion throughout each voxel is then determined at 76. Each average is determined in accordance with well-known assessment techniques such that a value of diffusion is calculated along each direction of diffusion in each voxel. Thereafter, individual diffusion values for one or more selected directions are determined at 78. The difference between each individual diffusion value and the average difference value is then summed at 80. From the individual diffusion values and the average diffusion value, a diffusion index or metric G(A,B) as defined by Eqn. 1 is determined at 82. After G(A,B) is determined for the selected voxels, process 70 either prompts the user or automatically determines whether more voxels are to be inspected at 84. If so 84, 86, process 70 returns to step 74. If not 84,88, the process ends at 90.

Regarding G(A,B), if either voxel is isotropic, the covariance term in the numerator, as well as the index, will be 0. Also, this covariance term will be positive if the larger diffusion terms in the voxels are aligned, and smaller (or negative) if they are not. Further, the normalization in the denominator keeps the index from varying with the average diffusion in either voxel. Thus the value of the index will reflect only the shape and relative orientation of the measured diffusion in the selected two voxels.

Figure 3:
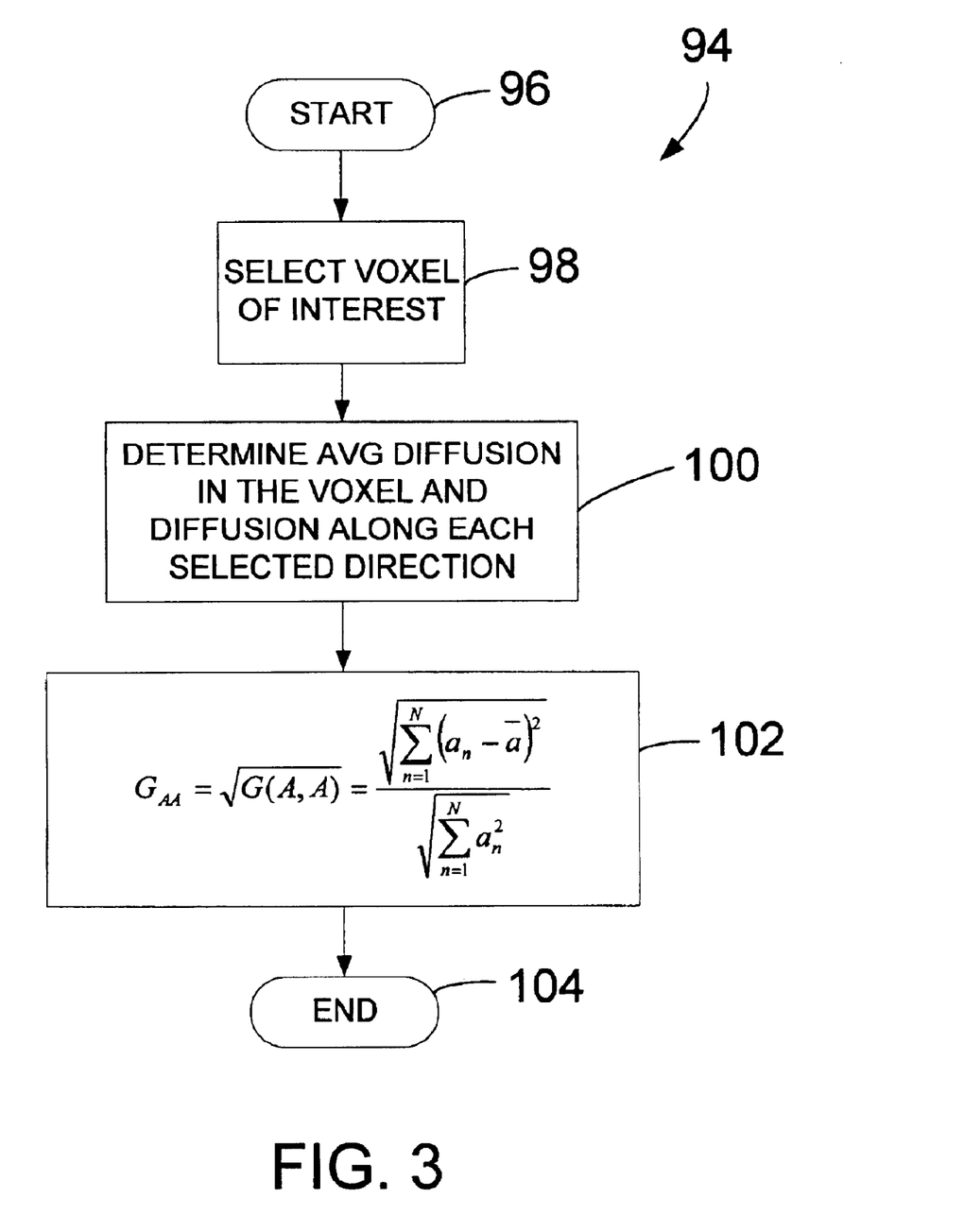
FIG. 3 is a flow chart setting forth the steps of a technique of determining fractional anisotropy in a selected voxel.

Referring now to FIG. 3, the steps of a technique in accordance with another embodiment of the invention are step forth. Process 94 is implemented to determine fractional anisotropic behavior in a single selected voxel. Process 94 is similar the technique of FIG. 2, but is used to quantify diffusion in a single voxel rather than multiple adjacent voxels. Process 94 begins at step 96 with the acquisition or accessing of diffusion weighted MR data. The data may be newly acquired MR data or accessed from a memory location. At step 98, a voxel is selected for evaluation. Accordingly, an average diffusion value for the selected voxel is determined or otherwise calculated at 100 as is a value of diffusion relative to each selected direction. At step 102, the process carries out the necessary processing and calculations to solve Eqn. 5 discussed above. From the output value of Eqn. 5, as described previously, fractional anisotropic behavior in the selected voxel may be determined. Process 94 then ends at 104 or may be repeated to assess fractional anisotropic behavior in another voxel.

The present invention may also be used to develop a filter for smoothing noise between adjacent voxels. That is, for two adjacent voxels, A and B, G(A,B), as defined by Eqn. 1, is large, if and only if, voxels A and B are anisotropic and 'pointing' in the same direction. Specifically, G(A,B) may be expressed as:

$$G(A,B) = G_{AA} * G_{BB} * C_{os}(2\theta) \quad \text{(Eqn. 20)};$$

where $G_{AA}$ and $G_{BB}$ correspond to fractional anisotropy wherein voxels A and B, respectively, and θ corresponds to the angular difference between the primary diffusion directions in voxels A and B. Further, because of the relationship defined by Eqn. 20, the values from Eqn. 1 and Eqn. 5 may be used to determine the relative difference in directions. As a result, G(A,B), as determined by Eqn. 1, may be used as a coefficient for smoothing neighboring voxels to reduce noise. For example, for brain imaging, only, white matter voxels that are in the same tract are averaged together, which preserves small tracts and tract edges. In this regard, this embodiment of the present invention is particularly well-suited for preparing MR data for tractography processes.

Therefore, in accordance with one embodiment, the present invention includes a method of assessing diffusion of a substance in a region-of-interest. The method includes the steps of determining a diffusion value for one or more individual directions in at least one voxel and determining a value of average diffusion in the at least one voxel. The method further includes the step of, from the individual diffusion values and the average diffusion value, determining a diffusion index indicative of diffusion along the first direction in the at least one voxel.

According to another embodiment, the present invention includes an MRI apparatus comprising a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images. The system also includes a computer programmed to access diffusion-weighted imaging data from a region-of-interest and isolate at least two adjacent voxels within the region-of-interest. The computer is further programmed to determine a metric indicative of diffusion along multiple directions in the at least two voxels without fitting diffusion-weighted imaging data from the at least two adjacent voxels to a tensor model.

In accordance with another embodiment of the present invention, a computer: readable storage medium having stored thereon a computer program representing a set of instructions is provided. The set of instructions, when executed by a computer, causes the computer to determine an individual diffusion value for each of N diffusion directions in at least one voxel and determine an average diffusion value for the at least one voxel. The set of instructions further causes the computer to determine a diffusion index indicative of diffusion anisotropy and diffusion direction in the at least one voxel.

The present invention has been described in terms of the preferred embodiment, and it is recognized that equivalents, alternatives, and modifications, aside from those expressly stated, are possible and within the scope of the appending claims.

What is claimed is:

1. A method of assessing diffusion of a substance in a region-of-interest comprising the steps of:
   (A) determining an average diffusion value in at least one voxel;
   (B) determining a respective diffusion value for one or more diffusion directions in the at least one voxel; and
   (C) from the respective diffusion values and the average diffusion value, determining a diffusion index indicative of diffusion in the at least one voxel.

2. The method of claim 1 further comprising the step of selecting one voxel and determining a fractional anisotropic diffusion value in the one voxel by determining a normalized standard deviation of diffusion along the one or more diffusion directions in the selected voxel.

3. The method of claim 1 wherein the at least one voxel includes two adjacent voxels and further comprising the step of determining a metric related to the diffusion anisotropy in each voxel and the angle difference between the primary diffusion directions.

4. The method of claim 3 further comprising the step of determining fractional anisotropic diffusion value for the other voxel and multiplying the fractional anisotropic diffusion value of the one voxel to the fractional anisotropic diffusion value of the other voxel, and determining the angle difference from the respective fractional anisotropic diffusion values and the diffusion index.

5. The method of claim 4 further comprising the step of determining if diffusion in the two adjacent voxels is anisotropic and if the diffusion in each voxel is commonly aligned.

6. The method of claim 1 further comprising the steps of:
determining diffusion in the at least one voxel relative to two or more axes of reference;
comparing diffusion in the at least one voxel along the two or more axes of reference; and from the comparison determining the direction which best correlates to diffusion in the at least one voxel.

7. The method of claim 6 further comprising the step of displaying, with color-coding, diffusion relative to each axis in an image.

8. The method of claim 1 further comprising the step of determining a diffusion anisotropy index without fitting diffusion data to a tensor model.

9. The method of claim 1 further comprising the step of repeating steps (A)–(C) for another at least one voxel.

10. The method of claim 1 wherein the one or more diffusion directions include more than six diffusion directions in the at least one voxel.

11. An MRI apparatus comprising:
a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and
a computer programmed to:
access diffusion-weighed imaging data from a region-of-interest;
isolate at least two adjacent voxels within the region-of-interest; and
determine a metric indicative of diffusion along multiple directions in the at least two adjacent voxels without fitting diffusion-weighted imaging data form the at least two adjacent voxels to a tensor model.

12. The MRI apparatus of claim 11 wherein the computer is further programmed to select one of the at least two adjacent voxels and determine fraction anisotropic diffusion in the one voxel.

13. The MRI apparatus of claim 11 wherein the metric is defined by:

$$G(A, B) = \frac{\sum_{n=1}^{N}[(a_n - \overline{a})(b_n - \overline{b})]}{\sqrt{\sum_{n=1}^{N} a_n^2 \sum_{n=1}^{N} b_n^2}}; \text{ and}$$

wherein ($a_n$) and ($b_n$) are the diffusion values measured in N different directions for voxels A and B, and $\overline{a}$ and $\overline{b}$ are the respective average values.

14. The MRI apparatus of claim 13 wherein a value of anisotropic diffusion in the one voxel is defined by:

$$G_{AA} = \sqrt{G(A, A)} = \frac{\sqrt{\sum_{n=1}^{N}[(a_n - \overline{a})^2]}}{\sqrt{\sum_{n=1}^{N} a_n^2}}.$$

15. The MRI apparatus of claim 11 wherein the computer is further programmed to determine a smoothing coefficient to reduce noise in the at least two adjacent voxels.

16. A computer readable storage medium having stored thereon a computer program representing a set of instructions, which when executed by a computer, causes the computer to:
determine an individual diffusion value for each of N diffusion directions in at least one voxel;
determine an average diffusion value for the at least one voxel; and
determine a diffusion index indicative of diffusion anisotropy and diffusion direction in the at least one voxel.

17. The computer readable storage medium of claim 16 wherein the set of instructions further causes the computer to:
determine diffusion in the at least one voxel relative to two or more axes of reference;
compare diffusion in the at least one voxel along the two or more axes of reference; and from the comparison determine which direction which best correlates to diffusion in the at least one voxel.

18. The computer readable storage medium of claim 16 wherein N includes more than six diffusion directions.

19. The computer readable storage medium of claim 16 wherein the set of instructions further causes the computer to determine the diffusion index without fitting diffusion data to a tensor model.

20. The computer readable storage medium of claim 16 wherein the set of instructions further causes the computer to determine a smoothing coefficient to reduce noise in adjacent voxels.

* * * * *

UNITED STATES PATENT AND TRADEMARK OFFICE
CERTIFICATE OF CORRECTION

PATENT NO. : 6,853,189 B1
DATED : February 8, 2005
INVENTOR(S) : James G. Pipe

It is certified that error appears in the above-identified patent and that said Letters Patent is hereby corrected as shown below:

Column 11,
Line 52, delete "form" and substitute therefor -- from --.

Signed and Sealed this

Tenth Day of May, 2005

JON W. DUDAS
*Director of the United States Patent and Trademark Office*